United States Patent
Kunc et al.

(10) Patent No.: US 7,324,040 B2
(45) Date of Patent: Jan. 29, 2008

(54) METHOD OF AUTOMATICALLY SETTING THE GAIN OF AN INTERROGATOR RECEIVER WITHIN A NON-CONTACTING IDENTIFICATION SYSTEM

(76) Inventors: Vinko Kunc, Gerbiceva 50, Ljubljana (SI) 1000; Anton Stern, Srednja vas 34, Sencur (SI) 4208

( * ) Notice: Subject to any disclaimer, the term of this patent is extended or adjusted under 35 U.S.C. 154(b) by 0 days.

(21) Appl. No.: 10/540,553

(22) PCT Filed: Dec. 22, 2003

(86) PCT No.: PCT/SI03/00046

§ 371 (c)(1),
(2), (4) Date: Jan. 17, 2006

(87) PCT Pub. No.: WO2004/059564

PCT Pub. Date: Jul. 15, 2004

(65) Prior Publication Data

US 2006/0133545 A1    Jun. 22, 2006

(30) Foreign Application Priority Data

Dec. 24, 2002   (SI)  ................. P 200200316

(51) Int. Cl.
*G01S 13/00* (2006.01)
*G01S 13/74* (2006.01)

(52) U.S. Cl. .................. 342/91; 342/89; 342/42; 342/44; 342/47

(58) Field of Classification Search ............... 375/45, 375/130–153; 342/91, 92, 42, 89, 175–205, 342/44, 47; 331/172–174; 340/10.33, 10.34, 340/10.42, 10, 10.1–10.52, 10.3–10.6, 10.32, 340/825.22

See application file for complete search history.

(56) References Cited

U.S. PATENT DOCUMENTS

| | | | | | |
|---|---|---|---|---|---|
| 3,239,835 | A | * | 3/1966 | Crow | 342/49 |
| 3,599,864 | A | * | 8/1971 | Liddle | 236/48 R |
| 3,969,725 | A | * | 7/1976 | Couvillon et al. | 342/47 |
| 4,010,465 | A | * | 3/1977 | Dodington et al. | 342/35 |
| 4,047,171 | A | * | 9/1977 | Fugit | 342/51 |
| 4,325,146 | A | * | 4/1982 | Lennington | 398/108 |
| 4,491,930 | A | * | 1/1985 | Hyatt | 708/3 |
| 4,893,539 | A | | 1/1990 | Nishimoto | |
| 5,276,430 | A | * | 1/1994 | Granovsky | 340/572.4 |
| 5,537,105 | A | * | 7/1996 | Marsh et al. | 340/10.32 |
| 5,721,552 | A | | 2/1998 | Rossius et al. | |

(Continued)

*Primary Examiner*—Thomas H. Tarcza
*Assistant Examiner*—Hien Ly
(74) *Attorney, Agent, or Firm*—Jacobson Holman PLLC

(57) ABSTRACT

An attack is activated in a receiver amplifier of an interrogator whenever an amplified input signal exceeds an attack threshold voltage value Vatt, and the receiver amplifier at least during a waiting period, the length of which preferrably equals the double length of the longest time interval between adjacent pulses in a transponder data wave packet, after the end of the attack does not respond in the sense of setting the gain. However, the amplifier responds with a decay activated after the lapse of the waiting period, which started when the instantaneous amplified signal value for the last time after the end of the attack exceeded a waiting threshold voltage level Vw. The decay rate is of the same order of magnitude as the attack rate. The improved method for automatically setting the gain renders it possible that the interrogator receiver within the non-contacting identification system practically does not change the essential characteristics of the input signal.

3 Claims, 2 Drawing Sheets

U.S. PATENT DOCUMENTS

| | | | |
|---|---|---|---|
| 5,809,142 A * | 9/1998 | Hurta et al. | 705/68 |
| 6,122,331 A | 9/2000 | Dumas | |
| 6,360,090 B1 * | 3/2002 | Holcombe et al. | 455/307 |
| 6,661,336 B1 * | 12/2003 | Atkins et al. | 340/10.2 |
| 6,975,206 B2 * | 12/2005 | Reining | 340/10.2 |
| 7,046,122 B1 * | 5/2006 | Forster | 340/10.33 |
| 2002/0008578 A1 * | 1/2002 | Wright et al. | 330/149 |
| 2002/0015436 A1 * | 2/2002 | Ovard et al. | 375/130 |
| 2004/0179547 A1 * | 9/2004 | Kuffner et al. | 370/465 |
| 2005/0169345 A1 * | 8/2005 | Urbas et al. | 374/100 |

* cited by examiner

METHOD OF AUTOMATICALLY SETTING THE GAIN OF AN INTERROGATOR RECEIVER WITHIN A NON-CONTACTING IDENTIFICATION SYSTEM

This is a nationalization of PCT/SI03/000046 filed Dec. 22, 2003 and published in English.

BACKGROUND OF THE INVENTION

1. Field of the Invention

The present invention relates to an improvement of such method for automatically setting the gain of an interrogator receiver within a non-contacting identification system, which system consists of the interrogator and several transponders, that an attack in a receiver amplifier of the interrogator is activated each time when an amplified input signal exceeds an attack threshold voltage level, and a decay is activated after the attack has ended, the improvement being accomplished by means of considering at the characteristics of the communication between the interrogator and the transponders.

2. Description of the Related Art

A non-contacting identification system consists of an interrogator generating radio frequency electromagnetic waves, and of one or several transponders, for which said electromagnetic waves represent an energy source. The transponders send data to the interrogator by transmitting appropriately modulated waves as received.

Variations, as produced by said modulation, in the level of the received signal are amplified in a receiver of the interrogator. In order to cover the largest possible communication space region, the receiver has the largest gain as allowed by the input noise level. The range of levels of the received signal is namely rather wide since the distance between the interrogator and any one of the transponders may be quite different, actually from practically zero to the largest distance across which the communication is still possible. Therefore the receiver has a high gain to reliably receive even very low input signals. In order that no difficulties at the amplification of high input signals appear, any known method is used, which are of two kinds: either the amplified input signal is limited or the receiver gain is automatically adjusted to the input signal level.

In the known methods of the first kind the amplified input signal is limited in the amplifying stage, in which a resistor in an amplifier feed-back loop is shunted by a Zener diode; when the signal amplitude exceeds the Zener diode threshold, the gain is immediately reduced. A drawback is that the ratio of the useful signal to the noise signal at the output of the amplifier is worse than at its input.

In the known methods of the second kind the gain is set automatically, e.g. according to patent U.S. Pat. No. 5,929,706. They are especially known in the field of telecommunications and audio systems. According to this method, when the input signal level is high, the gain of the receiving path is automatically adjusted, i.e. lowered, so that the received signal remains within the linear receiver operation region.

When an overly high signal is detected, an attack is immediately—no waiting phase is provided—activated, so a rapid gain lowering is started until an appropriate signal height is attained. At that moment or when the attack signal ceases to exist, the decay immediately begins (MOTOROLA Analog IC Device Device Data MC 1490 p. 7). So the gain rises slowly to a high level, on which the system persists till the next attack. When the sine-shaped input signal is high for a fairly long time, the output amplitude is really lowered below the limit of a gain correcting activation, yet the decay again raises the output signal out of the linearity region and therefore the attack is activated once again. The system permanently switches over between the states of the attack and the decay. The attack rate must be several orders of magnitude above the decay rate, moreover, both rates must be matched to the nature and the frequency spectrum of the input signals.

In patent U.S. Pat. No. 6,122,331 a circuit with an automatically settable gain is disclosed, wherein the attack is not activated when a change in the gain becomes necessary, but wait phase is enforced. A next time interval when the signal height is close to zero, is selected as preferred gain transition region. Thus, an output signal is distorted to a lowest degree. The circuit is foreseen for continuous signals and does not exploit the characteristics of pulsating signals in the form of wave packets.

BRIEF SUMMARY OF THE INVENTION

BRIEF DESCRIPTION OF THE DRAWINGS

Consequently, the technical problem to be solved by the present invention is how to improve a method for automatically setting the gain of an interrogator receiver within a non-contacting identification system so that, regardless of a large or small distance of an individual transponder from the interrogator, the level of the received signal in final amplification stages of this receiver will be below the upper limit of the linear region, whereat the improvement should be based on the characteristics of transponder signals in the form of wave packets.

The said technical problem is solved by a method for automatically setting the gain of an interrogator receiver within a non-contacting identification system consisting of the interrogator and several transponders, according to which method, within a receiver amplifier of the interrogator, an attack is activated each time when an amplified input signal exceeds an attack threshold voltage level Vatt, and a decay is activated after the attack has ended, the method of the invention being characterized in that the amplifier responds with a decay activated after the lapse of a waiting period, which started when the instantaneous amplified signal value for the last time after the end of the attack exceeded a waiting threshold voltage level Vw.

The method of the invention is further characterized in that the decay rate is of the same order of magnitude as the attack rate and that the length of the waiting period equals a double length of the longest time interval between adjacent pulses in a transponder data wave packet.

The method for automatically setting the gain as improved by the invention renders it possible that the interrogator receiver within a non-contacting identification system practically does not change the essential characteristics of the input signal.

Figure 1:
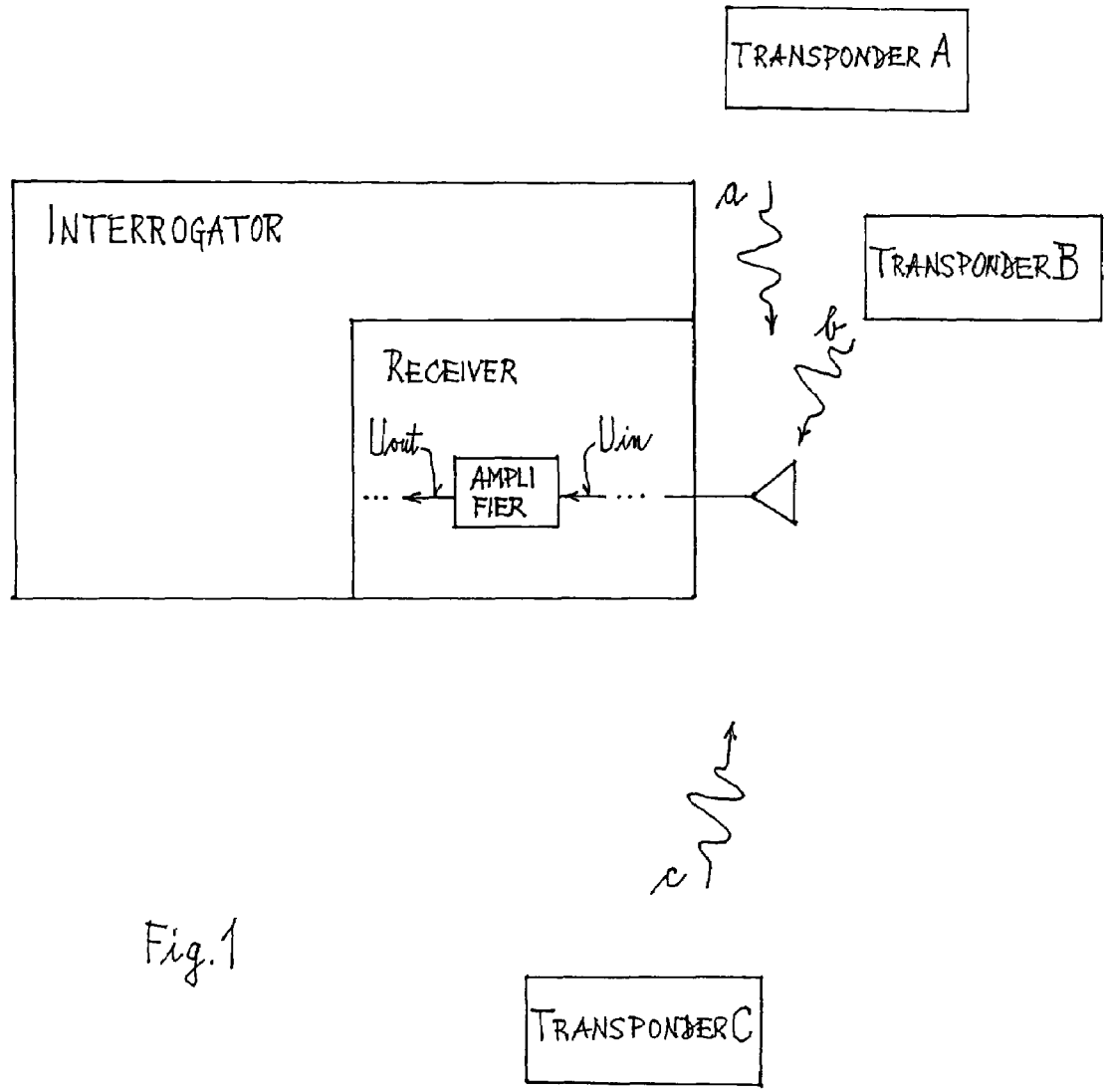
Figure 2:
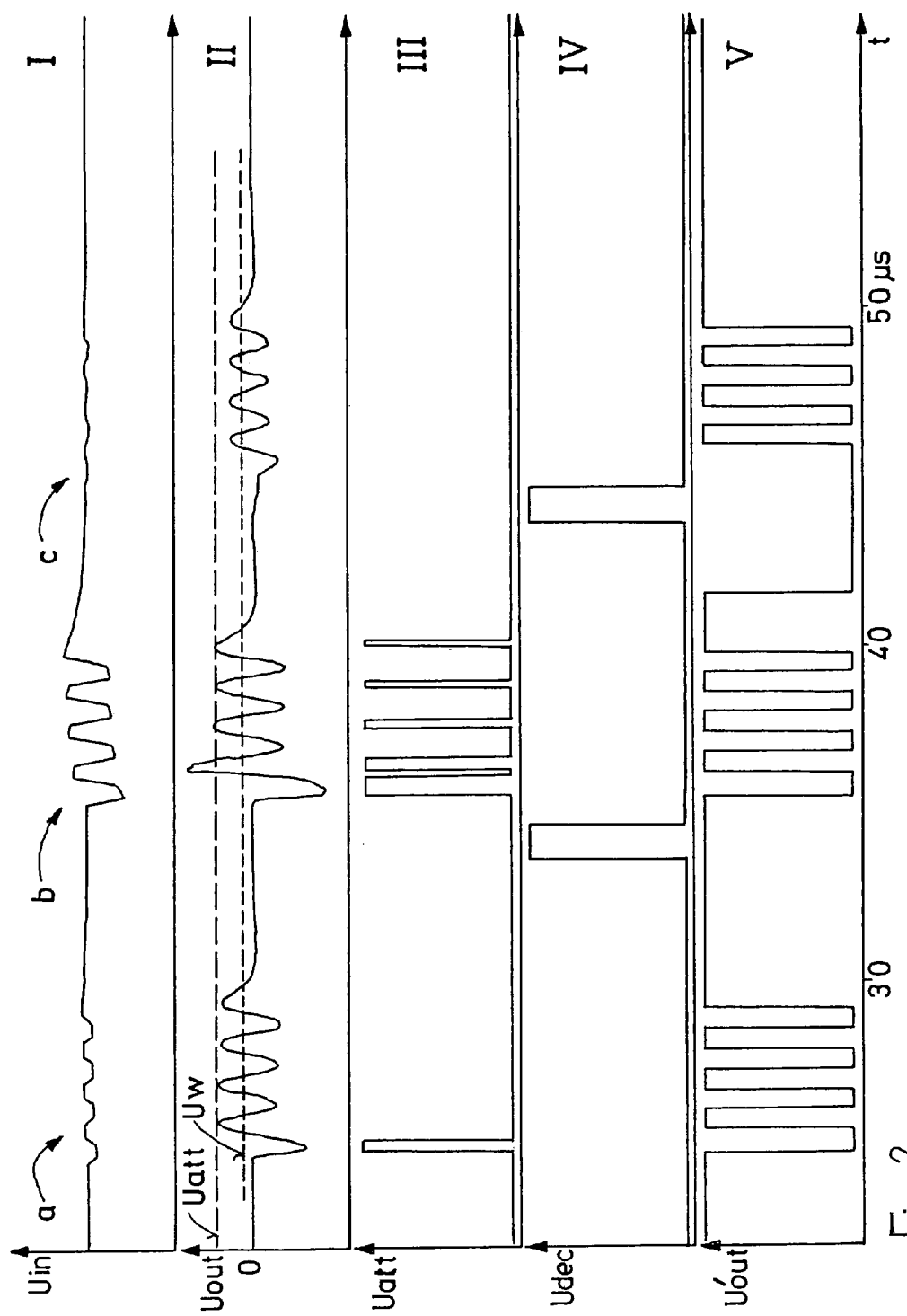

The invention will now be explained in more detail by way of the description of an embodiment and with reference to the accompanying drawing, which in FIG. 1 represents an interrogator and data wave packets arriving from a relatively close transponder, a rather close transponder and a remote transponder, and FIG. 2 represents the time dependence of the voltage at an input and output of a receiver amplifier in the interrogator, an attack signal and a decay signal and the time dependence of the voltage at the output of the receiver amplifier in a digital representation for the three wave packets having different intensities.

DETAILED DESCRIPTION OF THE INVENTION

In a non-contacting identification system (FIG. 1), which consists of an interrogator and several transponders, an improved method for automatically setting the gain of an interrogator receiver is used.

The known method (MOTOROLA, supra), according to which in a receiver amplifier of the interrogator an attack is activated each time when an amplified input signal exceeds an attack threshold voltage level Vatt and a decay is immediately activated after the attack has ended, is improved by the invention as follows.

After the attack has ended, a waiting phase is provided, in which the amplifier does not respond in the sense of gain-setting. However, the amplifier responds with a decay after the lapse of a waiting period, which started when the instantaneous amplified signal value for the last time after the end of the attack exceeded a waiting threshold voltage level Vw.

The shortest and the longest time interval between adjacent pulses in a data wave packet are precisely determined by the communication protocol: signal frequency spectrum is namely known and it can be exactly determined for the purpose of the method of the invention when the data wave packet ceased to arrive, in order that a fast decay is activated after the lapse of the waiting period. However, it is also known that the input signal level in the data wave packet is nearly constant, and it is expected that the transponder can not considerably change its position during the transmission of a particular data wave packet. Therefore, the gain is set at the beginning of the wave packet arrival and it is retained constant till the wave packet arrival has ceased. Herefrom the following requirements are derived, which render possible that the interrogator receiver within the non-contacting identification system, functioning according to the improved method for automatically setting its gain, practically does not change the essential characteristics of the input signal.

The decay rate is high and of the same order of magnitude as the attack rate. The length of the waiting period equals the double length of a longest time interval between adjacent pulses in the transponder data wave packet.

However, the attack rate must be high enough that an appropriate signal level is established already after initial pulses of the data wave packet.

Since the interrogator, e.g. after it has completed the communication with a first transponder situated near to the interrogator aerial, thus with a strong received signal, may begin to communicate with a remote another transponder, the received signal of which is weak, the decay rate must also be high in order that the amplifier quickly reaches a high gain.

Thus the interrogator, wherein the method of the invention for automatically setting the gain of its receiver is applied, has three operation phases: the attack, the waiting and the decay.

The method of the invention for automatically setting the gain of interrogator receiver within a non-contacting identification system functions as follows. The attack is immediately activated by the input signal Uin, the output signal Uout of which exceeds the attack threshold voltage level Vatt (cf. windows II and III in FIG. 2). The attack continues until the output signal Uout drops below the attack threshold voltage level Vatt. Then a waiting phase sets in, the length of which equals at least the length of the waiting period; during the waiting phase the gain remains unchanged. The decay is activated after the lapse of the waiting period, which started when the instantaneous amplified signal value for the last time after the end of the attack exceeded a waiting threshold voltage level Vw.

In a first window I in the FIG. the input signal Uin for three successive data wave packets is shown: the packet a arrived from a relatively close transponder A, the packet b from a rather close transponder B and the packet c from a remote transponder C (FIG. 1). In the second window II the analogous output signal Uout corresponding to the data wave packets a, b, c, and the (positive) attack threshold voltage level Vatt and the waiting threshold voltage level Vw are plotted, whereas the digital output signal U'out is represented in a window V. The digital output signal U'out for all three data wave packets a, b, c has nearly the same form in spite of their large difference in intensity. In windows III and IV an attack signal Uatt and a decay signal Udec are represented, which are activated in response to said three data wave packets a, b and c according to the proposed method.

At the arrival of the first data wave packet an attack is activated, which lasts until the output signal Uout drops below the attack threshold voltage level Vatt. Then the gain remains unchanged until the amplifier responds with the decay. The decay is activated after the lapse of the waiting period, which started when the instantaneous amplified signal value for the last time after the end of the attack exceeded the waiting threshold voltage level Vw.

At the arrival of the second data wave packet b the attack is activated. The attack lasts practically the whole time, while the wave packet b arrives; the output signal Uout namely exceeds the attack threshold voltage level Vatt even at the lowest settable gain. After the lapse of the waiting period following the cease of the data wave packet, the gain is reset to its highest value.

The invention claimed is:

1. Method for automatically setting the gain of an interrogator receiver within a non-contacting identification system consisting of the interrogator and several transponders, according to which method, within a receiver amplifier of the interrogator, a gain lowering is activated each time when an amplified input signal exceeds an attack threshold voltage level (Vatt), and a gain rising is activated after the gain lowering has ended, characterized in that the amplifier responds with the gain rising activated after the lapse of a waiting period which started when the instantaneous value of the amplified signal for the last time after the end of the gain lowering exceeded a waiting threshold voltage level (Vw).

2. Method as recited in claim 1, characterized in that the rate of the gain rising is of the same order of magnitude as the rate of the gain lowering.

3. Method as recited in claim 1, characterized in that the length of the waiting period equals a double length of the longest time interval between the adjacent pulses in a transponder data wave packet.

* * * * *